United States Patent [19]

Flory et al.

[11] Patent Number: 5,652,556
[45] Date of Patent: Jul. 29, 1997

[54] WHISPERING GALLERY-TYPE DIELECTRIC RESONATOR WITH INCREASED RESONANT FREQUENCY SPACING, IMPROVED TEMPERATURE STABILITY, AND REDUCED MICROPHONY

[75] Inventors: Curt Alan Flory, Los Altos; Robert Clark Taber, Palo Alto, both of Calif.

[73] Assignee: Hewlett-Packard Company, Palo Alto, Calif.

[21] Appl. No.: 559,805

[22] Filed: Nov. 17, 1995

Related U.S. Application Data

[63] Continuation of Ser. No. 238,675, May 5, 1994, abandoned.

[51] Int. Cl.$^6$ .................................................. H01P 7/10
[52] U.S. Cl. ................ 333/219.1; 333/234; 331/107 DP
[58] Field of Search ........................... 333/202, 219, 333/219.1, 234; 331/96, 107 DP

[56] References Cited

U.S. PATENT DOCUMENTS

| | | | |
|---|---|---|---|
| 4,028,652 | 6/1977 | Wakino et al. | 333/209 |
| 4,540,955 | 9/1985 | Fiedziuszko | 331/96 X |
| 4,667,172 | 5/1987 | Longshore et al. | 333/202 X |
| 5,027,090 | 6/1991 | Gueble et al. | 333/219.1 X |
| 5,036,299 | 7/1991 | Dick et al. | 331/135 X |

FOREIGN PATENT DOCUMENTS

| | | | |
|---|---|---|---|
| 1285549 | 1/1987 | U.S.S.R. | 333/219.1 |
| 1769265 | 10/1992 | U.S.S.R. | 333/219.1 |
| 0024970 | 12/1993 | WIPO | 333/219.1 |

OTHER PUBLICATIONS

C. A. Flory and R. C. Taber, "Microwave Oscillators Incorporating Cyrogenic Sapphire Dielectric Resonators", Jun. 2, 1993 IEEE International Frequency Control Symposium, pp. 763–773.

D. G. Blair and I. N. Evans, "High–Q Microwave Properties of a Sapphire Ring Resonator", J. Phys.D: Appl. Phys., 15 (1982) pp. 1651–1656 no month.

G. John Dick and David G. Santiago, "Microwave Frequency Discriminator with a Cryogenic Sapphire Resonator for Ultra–Low Phase Noise", 6th European Frequency & Time Forum, 1989 no month.

G. J. Dick and D. M. Strayer, "Measurement and Analysis of Cryogenic Sapphire Dielectric Resonators and DRO's", 4th Annual Frequency Control Symposium, 1987, pp. 487–491 no month.

David G. Santiago and G. John Dick, "Closed Loop Tests of the Nasa Sapphire Phase Stabilizer", 1993 IEEE International Frequency Control Symposium, pp. 774–777 no month.

(List continued on next page.)

*Primary Examiner*—Benny Lee
*Assistant Examiner*—David Vu

[57] ABSTRACT

A whispering gallery resonator constructed from a ring of dielectric material that is enclosed in a conducting cylindrical enclosure having a top and bottom. The dimensions of the dielectric ring and the enclosure are chosen such that any additional resonant frequencies of the resonator are at frequencies sufficiently different from the first resonant frequency to allow the resonator to be used in a free-running oscillator. In one embodiment of the present invention, material is removed from the dielectric ring at locations spaced equally around the ring to move the frequency of one of two degenerate modes. In a second embodiment of the present invention, the dimensions are chosen such that the resonator has a second resonant frequency which is also far from any spurious modes. In this embodiment, the dielectric ring is constructed from a material having first and second dielectric constants depending on the direction of polarization of electromagnetic waves in the material. The second resonant frequency corresponds to a resonant mode having an average field alignment that differs from that of the mode corresponding to the first resonant frequency. This arrangement allows the deviation of the temperature of the dielectric ring from the design temperature to be determined and corrected via a feedback loop and heater. Support structures are provided to position the dielectric ring with respect to the top and bottom of the cylindrical enclosure.

12 Claims, 11 Drawing Sheets

OTHER PUBLICATIONS

G. John Dick and Jon Sanders, "Measurement and Analysis of a Microwave Oscillator Stabilized by a Sapphire Dielectric Ring Resonator for Ultra-Low Noise," IEEE Transactions on Ultrasonics, Ferroelectrics, and Frequency Control, vol. 37, No. 5, Sep., 1990, pp. 339–346.

R. Comte, S. Verdeyme and P. Guillon, "New Concept for Low-Loss Microwave Devices", Electronics Letters, 3 Mar. 1994, pp. 419–420.

C. J. Maggiore, A. M. Clogston, G. Spalek, W. C. Sailor, and F. M. Mueller, "Low-Loss Microwave Cavity Using Layered-Dielectric Materials", Appl. Phys. Lett. 64 (11), 14 Mar. 1994, pp. 1451–1453.

J. D. Jackson, "Classical Electrodynamics (Resonant Cavities)", John Wiley & Sons, New York, (1975), Chapter 8, pp. 353–357 no month.

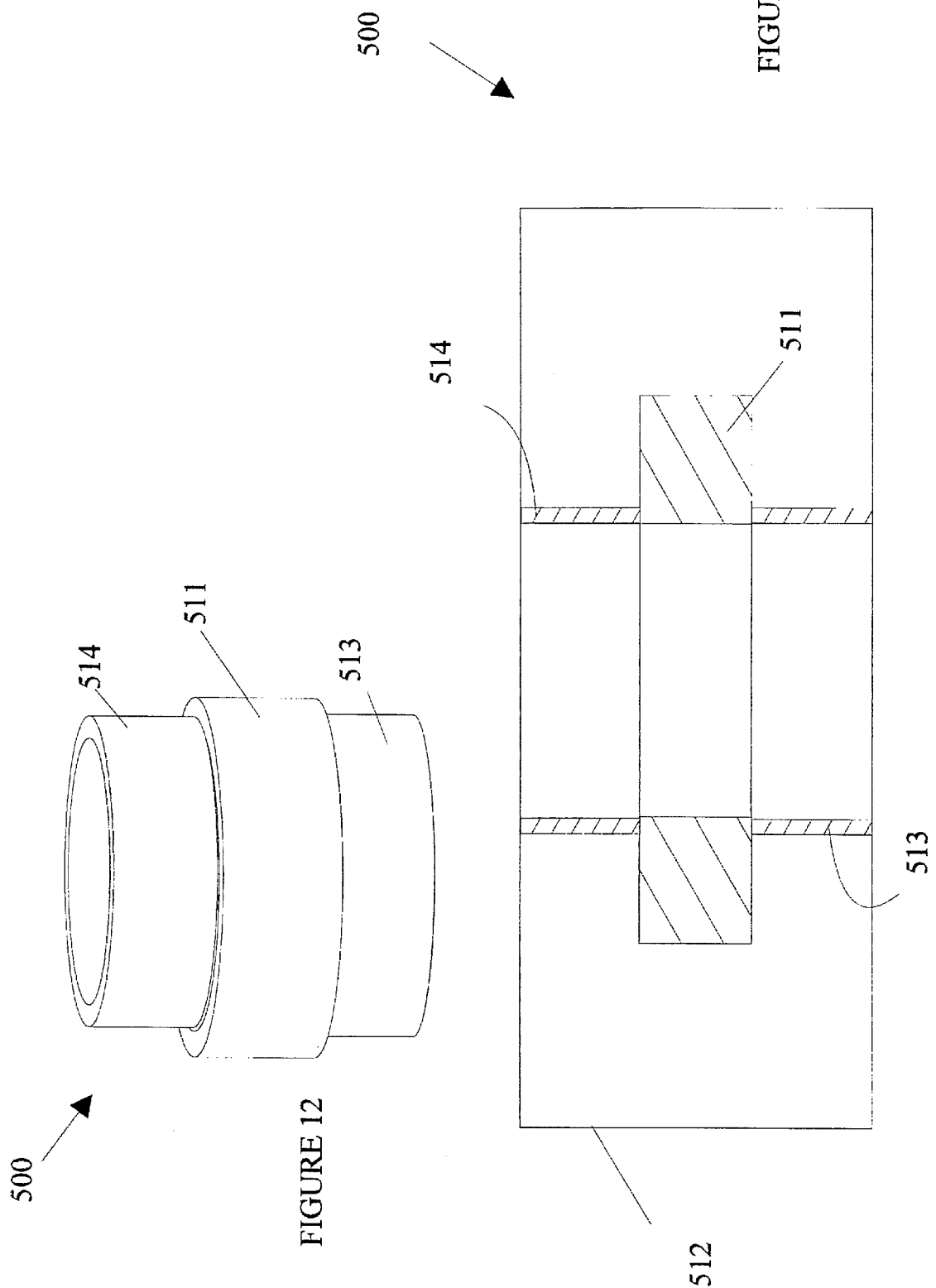

WHISPERING GALLERY-TYPE DIELECTRIC RESONATOR WITH INCREASED RESONANT FREQUENCY SPACING, IMPROVED TEMPERATURE STABILITY, AND REDUCED MICROPHONY

CROSS REFERENCE TO RELATED APPLICATION

This is a continuation of application Ser. No. 08/238,675 filed on May 5, 1994, now abandoned.

FIELD OF THE INVENTION

The present invention relates to resonator designs, and more particularly, to an improved dielectric resonator that is well suited for the construction of microwave oscillators and the like.

BACKGROUND OF THE INVENTION

Many microwave circuits depend on a reference oscillator constructed from an amplifier and a high Q resonator. There has been a long felt need for simple resonators with extremely high Q values. Simple metal cavities were the original prototype microwave resonators. The performance of these devices, however, is limited by the resistive losses in the enclosure walls. These losses result from currents generated in the walls by the electromagnetic fields in the cavity.

To reduce such losses, a low loss dielectric material is placed in the cavity. The material partially confines the electromagnetic fields within the dielectric, and thus decreases the relative strength of the fields and shielding currents at the enclosure walls. This resonator configuration is often referred to as a "loaded cavity" configuration. The performance limitations of loaded cavity resonators are governed by a combination of the loss tangent of the dielectric material, and the (reduced) currents in the enclosure walls.

The dielectric with the lowest known loss tangent at microwave frequencies is monocrystalline sapphire. Furthermore, the loss tangent of this material decreases with temperature, being proportional to $T^{-5}$. As a result, it is the material of choice for many high performance applications of dielectric resonators, particularly at cryogenic temperatures.

Unfortunately, sapphire dielectric resonators have a relatively low dielectric constant (K=10). As a result, the strength of the electromagnetic field external to the dielectric itself is still relatively high compared to materials with significantly higher dielectric constants. Thus, specialized design strategies are needed to reduce the losses due to the contributions from the electrical currents on the inside surfaces of the enclosure walls. In order to address this issue, two generic varieties of sapphire dielectric resonators have been extensively studied. The first type is a low order TE mode resonance of a cylindrical sapphire "puck" centered in a cylindrical conducting enclosure, and the second is the so-called "whispering gallery" resonator.

This first generic style of resonator generally has a performance limited by the enclosure wall loss, due to relatively weak confinement of the electromagnetic fields to the dielectric puck. Some improvement in Q values can be achieved by replacing the conducting end caps of the enclosure by high temperature super-conducting films. This reduces resistive losses, although in all reported work on sapphire dielectric resonators of this configuration, wall losses remain the dominant source of Q limitations. Another major drawback of this style of resonator is the extreme vibration sensitivity exhibited by such devices. This sensitivity results from the significant residual field at the enclosure walls for the mode in which the cavity operates. This leads to substantial mode variation when there is relative motion between the dielectric puck and the enclosure. This microphonic sensitivity causes severe degradation of the phase noise performance at low offset frequencies for oscillators based on dielectric resonators of this type.

The second generic type of sapphire dielectric resonator is the whispering gallery mode configuration. This type of resonator consists of a sapphire ring or disk which confines the electromagnetic energy to the dielectric region by a physical mechanism not unlike total internal reflection in optical systems. The modes can be qualitatively described as traveling waves around a bent dielectric waveguide which closes upon itself. This configuration provides strong electromagnetic energy confinement due to the existence of only evanescent fields outside of the dielectric structure. The relative field confinement increases rapidly as a function of mode number. Here, mode number is defined as the number of modal maxima encountered in one complete circuit of the ring. For mode numbers on the order of 7 or more, the relative field energy confinement is sufficient to significantly reduce the Q degradation from enclosure wall loss relative to the first type of resonator described above. Configurations of this type allow Q values approaching the limitations imposed by the internal sapphire loss mechanisms, as well as greatly reduced vibrational sensitivity.

Unfortunately, at microwave frequencies, the mode density in the frequency domain is extremely high. Hence, the desired resonant mode is typically very close in frequency to other, spurious, modes. These spurious modes consist of other whispering gallery modes as well as "hybrid" modes, which are simply the usual empty cavity modes perturbed by the presence of the sapphire ring. In prior art systems, the high mode density of the whispering gallery resonators has precluded their use in a simple flee-running oscillator with direct RF feedback because of the inherent difficulty of forcing the circuit to oscillate at only the desired resonance frequency.

As a result, prior art systems based on whispering gallery resonators have typically been limited to uses in which the whispering gallery resonator is used as a frequency discriminator to stabilize a lower performance local oscillator. This application is often feasible because the intrinsic stability of the local oscillator is usually sufficient to select the desired whispering gallery mode from the "dense forest" of modes in the resonator spectrum. Some work has also been done in attempting to clean up the dense mode spectrum by iteratively measuring, and then modifying, the resonator enclosure using microwave absorbers and frequency tuners to reduce the Q and coupling to the undesired modes. While this approach has reduced the number of undesired modes, it requires a tedious design procedure and still does not allow incorporation of a whispering gallery mode resonator into a simple direct feedback free-running oscillator. Consequently, the full benefits promised by the high Q and low vibration sensitivity of the whispering gallery resonator had not been realized in prior art systems.

Another problem that has prevented prior art whispering gallery resonators from being used in direct-feedback free-running oscillators has been the temperature coefficient of the dielectric constant. If the dielectric constant were independent of temperature, it would be possible to construct oscillators with center frequencies that were nearly independent of temperature. One prior art approach to solving this problem is to use a composite material that has an essentially zero temperature coefficient at the desired operating temperature. For example, some of the materials that have been commonly used for dielectric resonators are ceramics that have been produced from mixtures of components that have been carefully chosen to produce a zero temperature coefficient of the dielectric constant at some selected temperature.

Unfortunately, this approach cannot be used with sapphire, the substance of choice at microwave frequencies, since there is no way to directly influence the temperature coefficient of its dielectric constant without significantly degrading its loss tangent. At room temperature, the dielectric constant of sapphire changes by roughly 70 parts per million per degree K. While this value decreases approximately in proportion to $T^3$, the temperature dependence still presents a serious obstacle to stable oscillator operation even at temperatures as low as 20° K.

Yet another problem with whispering gallery resonators is a result of the fact that even for an ideal system, the modes of the whispering gallery resonator actually occur in perfectly degenerate pairs. The whispering gallery modes can be qualitatively described as traveling waves around a bent dielectric waveguide which closes upon itself, with the energy confinement and guiding occurring by a physical mechanism not unlike total internal reflection in optical systems. The symmetry of the system allows traveling waves to propagate in either direction around the ring, leading to a two-fold degeneracy of all whispering gallery modes. In actual practice, the two degenerate modes are not counter-propagating traveling waves, but rather standing waves rotated spatially by one quarter wavelength from one another.

Because of imperfections in real devices, as well as the non-zero size of the physical coupling loops used to transfer energy to and from the cavity, the nominally degenerate modes are perturbatively coupled, and their frequencies slightly separated. In addition, the coupling to the mode which has a magnetic field maximum at the azimuthal position of the (inductive) coupling loop is much stronger than that of the mode rotated by a quarter wavelength.

Unfortunately, this circumstantial frequency splitting, and preferential selective mode coupling are not enough to produce adequate mode separation. One crude method for forcing a frequency separation between the modes is to extend a very thin bar of sapphire through the enclosure wall, allowing it to press against the sapphire ring. If the point of contact is at a field null of the desired whispering gallery mode, and at a field maximum of its undesired degenerate sister-mode, the undesired mode will be strongly perturbed to a lower frequency due to dielectric loading. In contrast, the desired mode is relatively unchanged. Unfortunately, this technique has a number of drawbacks. First, the technique requires a fairly sensitive manual tuning of each device which increases the cost of the devices. Second, the offset of the undesired mode in frequency is relatively small and not well controlled. Finally, an additional piece of machined sapphire is required and the cavity must be provided with an additional opening and mechanisms for positioning the piece of sapphire relative to the resonator ring.

Yet another problem inherent in constructing high Q whispering gallery resonators is the method of supporting the resonator in order to maintain the desired geometry. If the resonator is placed firmly against one wall of the enclosure, most of the benefits of high mode confinement are lost. Thus, it is necessary to devise a mechanical support for the dielectric ring which appropriately addresses the mechanical, electromagnetic and thermal requirements of the resonator system.

These requirements are typically in conflict with each other. For the best mechanical properties, the support arrangement should be short and relatively massive, while the electromagnetic properties are optimized if the support is constructed from long, thin components with minimal cross-section. There are two key considerations relevant to the electromagnetic properties of the support. First, it is essential that the support not introduce extra loss. Typically, this will restrict the choice of materials for the support. A dielectric with low dielectric constant and minimal loss tangent is needed. Second, the support must avoid disrupting any of the electromagnetic modes of the resonator and its enclosure.

The support problem is particularly severe in the case of low dielectric constant resonators such as resonators made from sapphire. It should be noted that these problems are much less severe for dielectric resonators constructed from materials with a comparatively high dielectric constant. In such cases, a support material with a relatively much lower dielectric constant exists and can be used. Such a material will have a correspondingly low loss tangent which will not significantly influence the electromagnetic mode shape or dissipation. However, for dielectric resonator design, the materials with the lowest known loss tangents are sapphire and quartz, and these both have low dielectric constants.

Broadly, it is the object of the present invention to provide an improved whispering gallery resonator.

It is a further object of the present invention to provide a whispering gallery resonator in which the mode spacing around the mode of choice is sufficient to allow the resonator to be used in a simple direct feedback free-running oscillator.

It is a still further object of the present invention to provide a whispering gallery resonator which is less sensitive to external temperature fluctuations than prior art whispering gallery resonators.

It is yet another object of a pair of present invention to provide a whispering gallery resonator in which one of the degenerate modes is substantially shifted in frequency relative to the other.

It is a still further object of the present invention to provide a whispering gallery resonator with a support system having a low loss tangent while providing adequate rigidity.

These and other objects of the present invention will become apparent to those skilled in the art from the following detailed description of the invention and the accompanying drawings.

SUMMARY OF THE INVENTION

The present invention is a whispering gallery resonator constructed from a ting of dielectric material that is enclosed in a conducting cylindrical enclosure having a top and bottom. Loops are provided for coupling electromagnetic energy into and out of the enclosure so as to excite the resonant modes of the dielectric ring. The dimensions of the dielectric ring and the enclosure are chosen such that any additional resonant frequencies of the resonator are at frequencies sufficiently different from the first resonant frequency to allow the resonator to be used in a free-running oscillator. In the preferred embodiment of the present invention, the dielectric material is sapphire. In one embodiment of the present invention, material is removed from the dielectric ring at locations spaced equally around the ring to move the frequency of one of two degenerate modes. In a second embodiment of the present invention, the dimensions of the ring and the enclosure are chosen such that the resonator has a second resonant frequency. In this embodiment, the dielectric ring is constructed from a material having first and second dielectric constants, these constants depending on the polarization of the electromagnetic field in the material. The second resonant frequency corresponds to a resonant mode having an average field polarization that differs from that of the mode corresponding to the first resonant frequency.

This arrangement allows the deviation of the temperature of the dielectric ring from the design temperature to be determined. A feedback loop which includes a heater is used to maintain the dielectric ring at the design temperature. In another embodiment of the present invention, support structures are provided to position the dielectric ring with respect to the top and bottom of the cylindrical enclosure. The support structures contact the dielectric ring at three or more contact points. In one embodiment, the support structures comprise a plurality of planar support members, each such support member being in contact with one of the contact points and either the top or the bottom of the cylindrical enclosure. The preferred support member is triangular in shape with one point of the triangular shape in contact with the dielectric ring. An alternative support structure utilizes cylindrical supports.

BRIEF DESCRIPTION OF THE DRAWINGS

FIG. 12 is a perspective view of a dielectric ring and an alternate support structure.

FIG. 13 is a cross-sectional view of the support structure shown in FIG. 12.

DETAILED DESCRIPTION OF THE INVENTION

Figure 1:
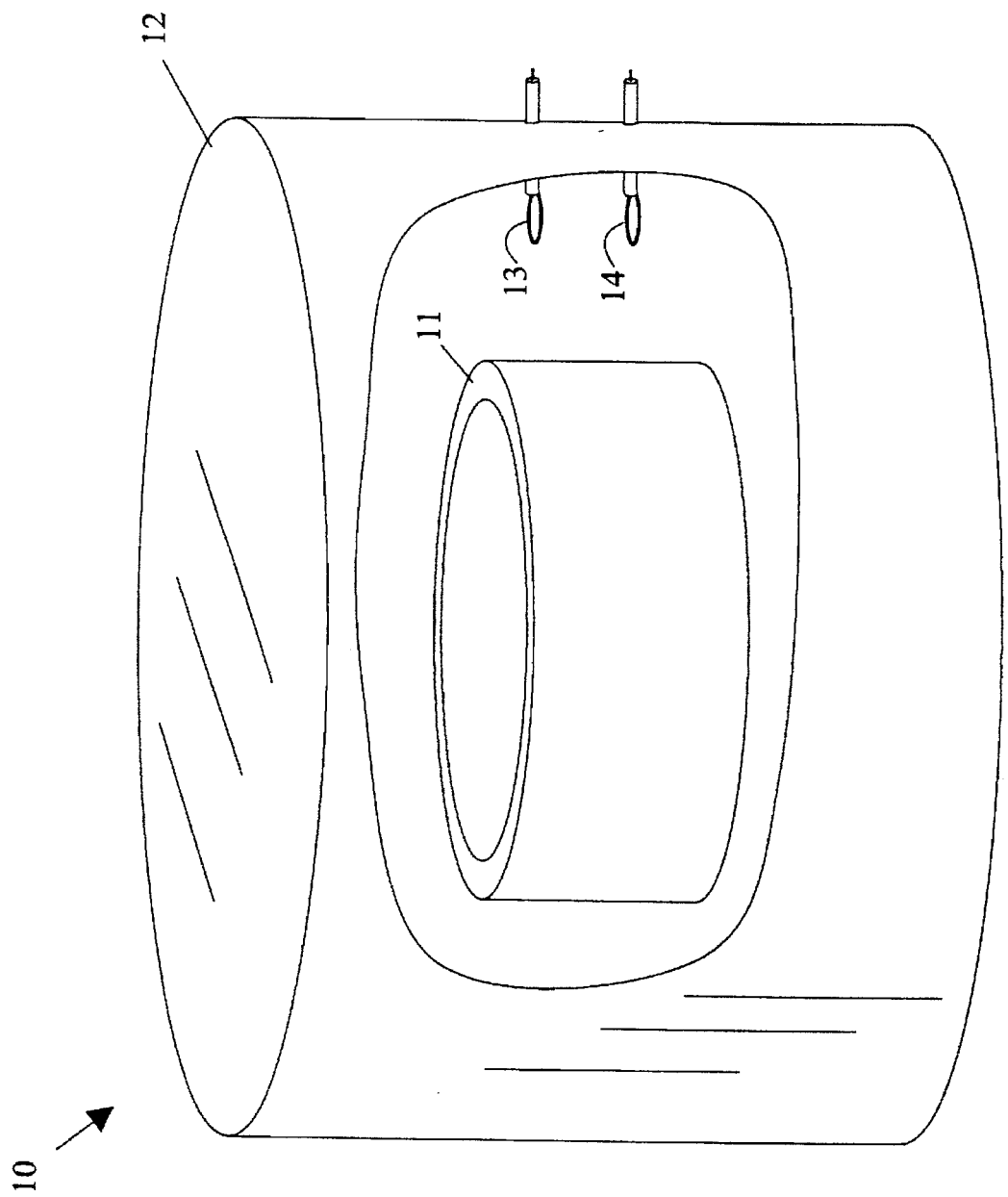
FIG. 1 is a cut-away view of a whispering gallery resonator according to the present invention.

The present invention may be more easily understood with reference to FIG. 1 which is cut-away view of a whispering gallery resonator 10 according to the present invention. Whispering gallery resonator 10 is constructed from a ring of dielectric material 11 symmetrically placed in a conducting cylindrical enclosure 12. Energy is typically coupled into and out of the resonator by two loops shown at 13 and 14, respectively, which are typically constructed by connecting the center conductor of a coaxial cable to the outside ground sheath.

In the preferred embodiment of the present invention, dielectric ring 11 is constructed from a sapphire crystal with the C-axis of the crystal parallel to the axis of the ring. The dielectric is not isotropic in the case of sapphire. As will be explained in more detail below, this anisotropy can be used to provide temperature stabilization of the resonator. For the purposes of the present discussion, it should be noted that the dielectric has different permittivities in the Z-direction and in directions transverse to the Z-direction. Here, the Z-direction is that parallel to the axis of dielectric ring 11.

The modes of resonator 10 can be computed by solving Maxwell's equations subject to the boundary conditions imposed by conducting cylindrical enclosure 12. It is assumed that all fields have harmonic time dependence and that the permittivity can be represented by a diagonal matrix having permittivities equal to the transverse and parallel permittivities of the resonator material. Details of the computation of the modes of a resonator such as resonator 10 may be found in C. A. Flory and R. C. Taber, "Microwave Oscillators Incorporating Cryogenic Sapphire Dielectric Resonators", *Proceedings of the 1993 IEEE International Frequency Control Symposium*, pp. 763–773 which is incorporated herein by reference.

Figure 2:
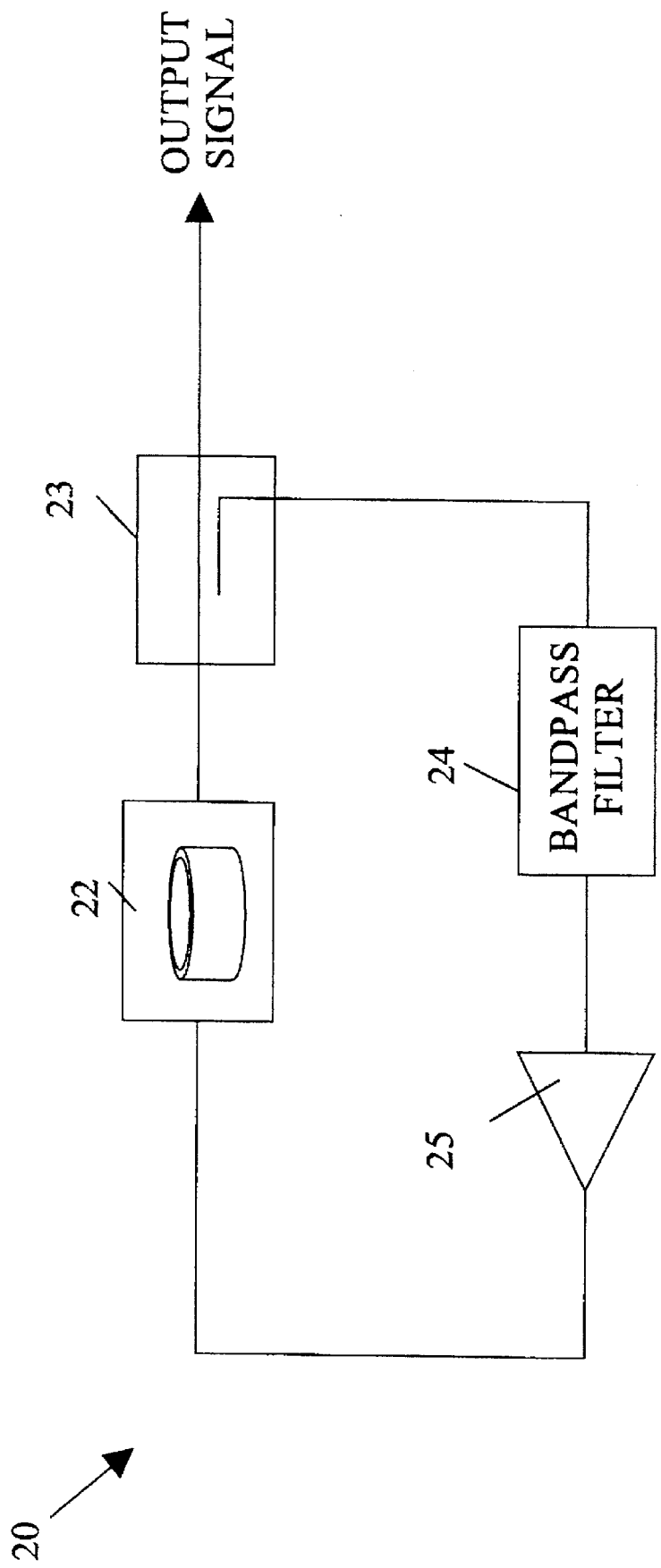
FIG. 2 is a schematic drawing of a free-running oscillator based on a whispering gallery resonator according to the present invention.

In the present invention, the computational method described above is used to select the physical dimensions of dielectric ring 11 and enclosure 12 such that no modes exist near the frequency of the desired mode. The wavelength of the desired mode is roughly the circumference of the ring divided by an integer. In the preferred embodiment of the present invention, the integer is greater than or equal to 7. The optimization procedure, in effect, opens a window in the forest of spurious modes that surround the desired mode. The window is sufficient to allow the resonator to be used in a simple direct feedback free-running oscillator such as shown in FIG. 2 at 20. Oscillator 20 is constructed from the series combination of a whispering gallery resonator 22, a feedback amplifier 25, a bandpass filter 24 and a feedback coupler 23 which splits off some of the signal power generated in the loop as the output signal. The pass band of filter 24 is centered at the desired oscillation frequency.

In general, the whispering gallery resonator dimensions are determined by fixing the desired mode number, i.e., the number of wavelengths around the dielectric ring. The dimensions are then optimized for one frequency. For example, for a mode number of 7, a sapphire ring having an inner radius of 0.986 cm, an outer radius of 1.691 cm and a thickness of 1.033 cm when symmetrically placed in a conducting enclosure of radius 3.55 cm and length 2.900 cm results in a whispering gallery resonator having a resonance frequency of 9.60 GHz and a Q of 20 million at 77° K and a symmetrically placed "window" of 500 MHz about the desired mode. This design may be scaled to provide the dimensions of a mode 7 sapphire ring resonator at other frequencies. For example, doubling the size of each dimension results in a resonator having a resonance frequency at one half the above design frequency, i.e., 4.8 GHz.

As noted above, one problem with quartz or sapphire, the preferred materials for the dielectric, is their high temperature coefficient. This high temperature coefficient imposes constraints on the amount of temperate variation to which the whispering gallery resonator can be exposed. In the preferred embodiment of the present invention, the whispering gallery resonator also includes a temperature regulation system to reduce the temperature deviations from the design temperature.

The temperature control system utilized in the preferred embodiment of the present invention takes advantage of the fact that the dielectric constant of sapphire is anisotropic and that the temperature coefficients of the two separate dielectric constants are not the same. Parallel to the C-axis, the dielectric constant of sapphire is approximately 11.6, while the dielectric constant for fields perpendicular to the C-axis is approximately 9.4. The ratio of the temperature coefficients of the fractional deviation of these two dielectric constants is, itself, temperature dependent. It typically differs from unity by roughly 50%. If a resonator is constructed in such a way that it possesses two or more usable modes that differ significantly in their average field alignment, the modes will have center frequencies that deviate with temperature in different ways. In the preferred embodiment of the present invention, circuitry is provided which allows an evaluation of the ratio of center frequencies. The circuitry maintains a fixed ratio between these frequencies. Within the accuracy of the feedback system, the temperature will remain constant without reliance on the temperature sensitivity of any components other than the sapphire resonator itself.

Whispering gallery resonators provide an attractive vehicle for the implementation of sapphire dielectric resonators intended for thermal stabilization, as they possess a variety of modes of differing field alignment which share the property that they provide extremely good confinement of the electromagnetic field. When the field is well confined, the Q of the resonator will not be as severely limited by the electrical losses in the enclosure and mode frequencies will not be strongly influenced by the dimensions of the enclosure or variations in the position of the sapphire resonator relative to the enclosure. Using the above described mathematical model of the whispering gallery resonator, a whispering gallery dielectric resonator can be designed with two mode frequencies, $f_1$ and $f_2$ which will have a rational integer frequency ratio:

$$f_1 = \frac{N}{M} f_2 \qquad (1)$$

Where M and N are both integers. The design dimensions of the ring and enclosure must provide clean frequency windows about each mode. Due to the differing field alignments of the two modes, this condition will actually only occur at precisely one temperature. Exemplary physical dimensions would be an inner radius of 1.118 cm, an outer radius of 1.809 cm, and a ring thickness of 0.888 cm, with an enclosure height of 2.95 cm and a radius of 3.64 cm. This geometry would yield a mode frequency $f_1$ at 9.6 GHz and a second mode frequency $f_2$ at 12.0 GHz.

Figure 3:
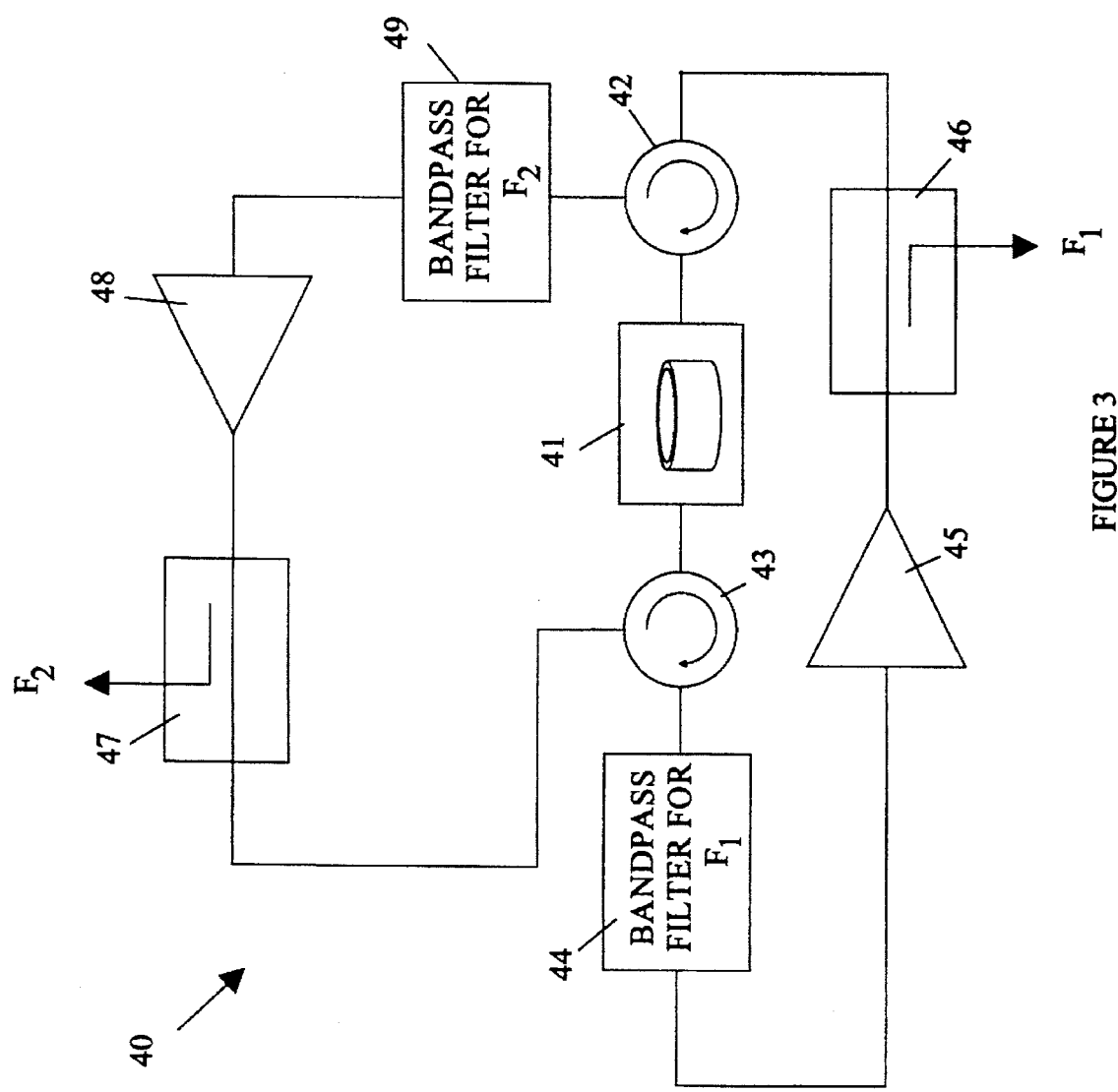
FIG. 3 is a schematic drawing of a free-running oscillator having two resonant frequencies which utilizes a whispering gallery resonator according to the present invention.
Figure 4:
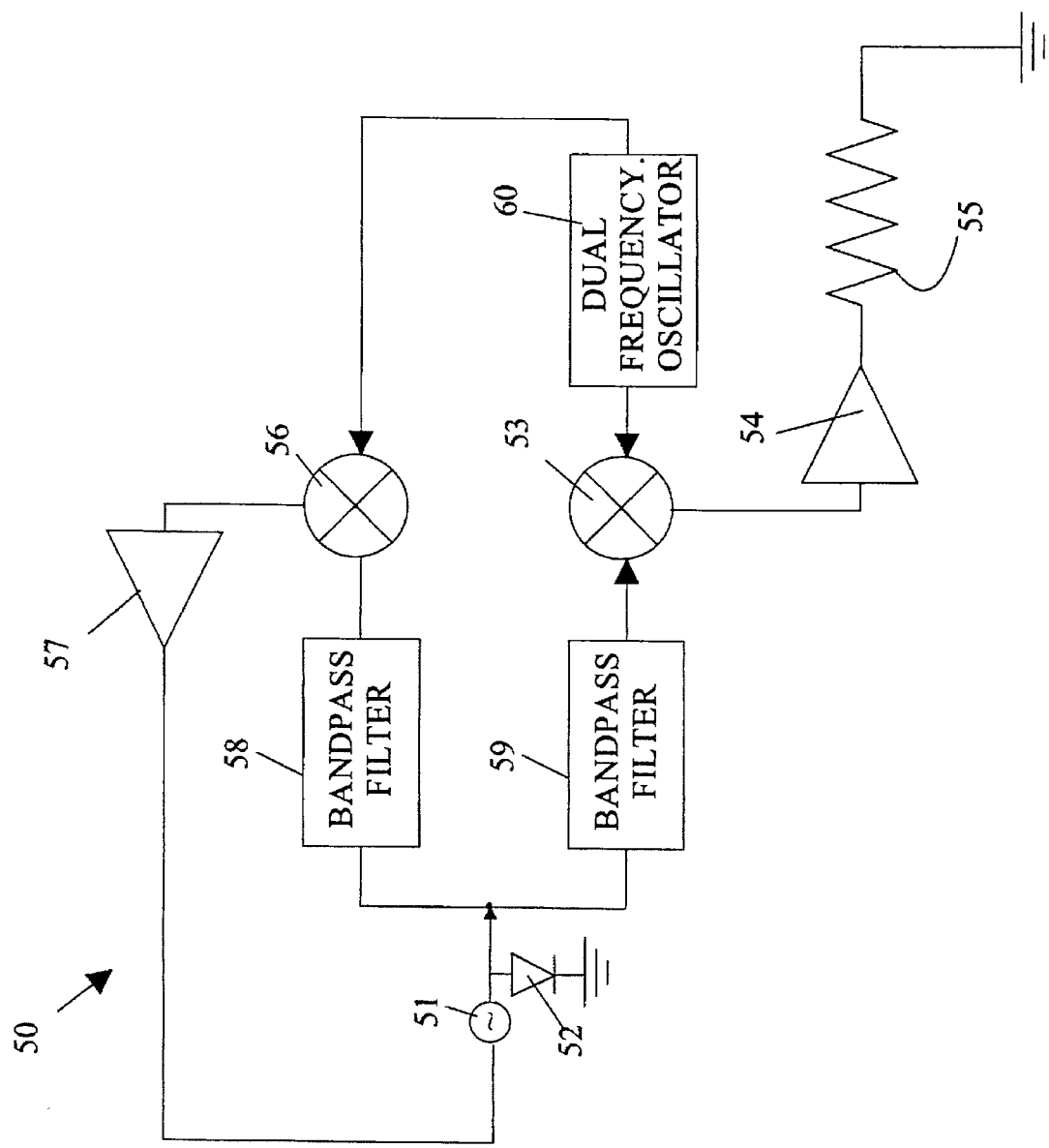
FIG. 4 is a schematic drawing of one embodiment of a temperature control system for a whispering gallery resonator according to the present invention.

Refer now to FIGS. 3 and 4. FIG. 3 is a block diagram of an example of a circuit which allows sustained oscillation at two separate mode frequencies. FIG. 4 is a block diagram of a circuit using the dual frequency oscillator shown in FIG. 3 to control the resonator temperature so as to maintain the design temperature. Dual frequency oscillator circuit 40 uses a whispering gallery resonator 41 that has two resonant frequencies at $F_1$ and $F_2$. The oscillator for generating $F_1$ is constructed from bandpass filter 44, amplifier 45, and circulators 42 and 43. A portion of the output of amplifier 45 is removed by feedback coupler 46 to provide the output signal. The signal generated by amplifier 45 is routed into whispering gallery resonator 41 by circulator 42. The output of whispering gallery resonator 41 is routed back to amplifier 45 by circulator 43 and bandpass filter 44. Similarly, oscillator for generating $F_2$ is formed by routing the output of amplifier 48 through circulator 43 into whispering gallery resonator 41. The output of whispering gallery resonator 41 generated from this signal is routed via circulator 42 and bandpass filter 49 back to amplifier 48. Feedback coupler 47 removes a portion of the output of amplifier 48 to provide the output signal at $F_2$.

Refer now to FIG. 4 which is a schematic diagram of a temperature regulating circuit 50 using a dual frequency oscillator 60 of the type shown in FIG. 3. The voltage controlled oscillator (VCO) 51 is designed to operate near the frequency $f_2/M$ and a simple phase locked loop arrangement is used to maintain the VCO at exactly $f_2/M$. The loop operates as follows. Frequency multiplier 52 generates a series of harmonics of $f_2/M$, including $Nf_2/M$. Mixer 53 which is fed from bandpass filter 59 which is set to a frequency of $Nf_2/M$ compares the phase of this signal to one of the outputs of dual frequency oscillator 60. This oscillator frequency is designed to $Nf_2/M$. A phase error between these two signals will cause amplifier 54 to alter the current through a heater 55 which is connected to the dielectric ring in the whispering gallery resonator in dual frequency circuit 60. The second output of dual frequency oscillator 60 is designed to be $f_2$. This output stabilizes the output of VCO 51 at $f_2/M$. It will be apparent to those skilled in the art that the response time of the temperature regulation must be fast enough to keep the phase error between signals below a fraction of a radian, or else temperature lock will be lost.

Figure 5:
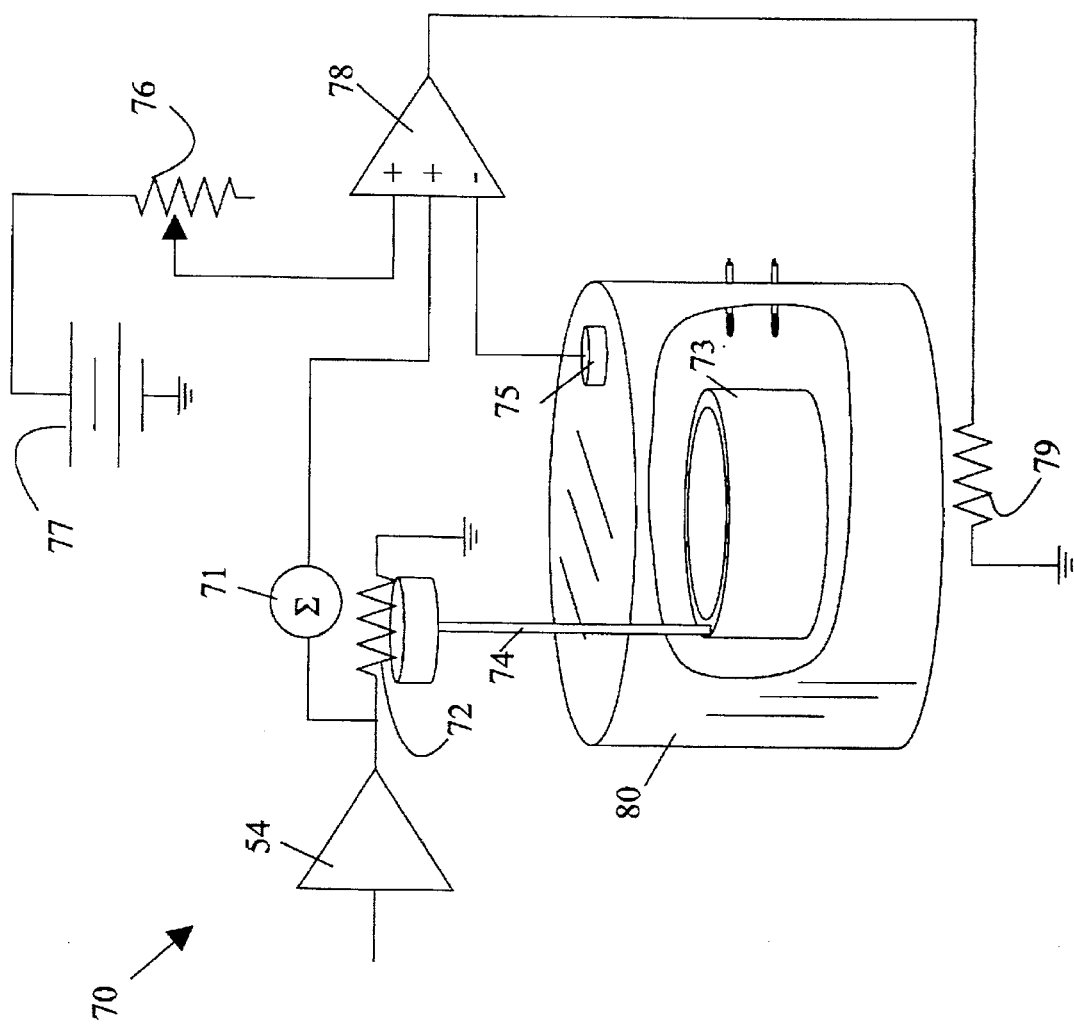
FIG. 5 is a schematic drawing of another embodiment of a temperature control system for a whispering gallery resonator according to the present invention.

The accuracy limit of this arrangement is limited by three factors, the temperature inhomogenities in the sapphire resonator, fluctuations in the behavior of the mixers, and phase fluctuations in the amplifier circuitry which sustains the oscillators. Temperature inhomogenities can be minimized by surrounding the resonator with an enclosure whose temperature regulation is slaved to the temperature feedback signal which is applied to the resonator itself. If the feedback signal to the resonator heater remains at a high level, the set-point of the temperature controller for the surrounding enclosure can be incremented upward, and vice versa. A schematic of this type of temperature regulation is shown in FIG. 5 at 70. The output from amplifier 54 shown in FIG. 4 is used to drive heater 72 which is in thermal contact with dielectric ring 73 via heat transfer rod 74. Heater 72 is mounted in such a way that it applies heat only to the sapphire resonator, while heater 79 is attached directly to enclosure 80. It is assumed that the thermal isolation between the sapphire resonator 73 and enclosure 80 is sufficient to guarantee that a small amount of heat supplied by the heater 72 can shift the resonator temperature without influencing the enclosure temperature. The above scheme will only function adequately if the temperature of the resonator is near that of the design temperature. A thermometer 75 is used in conjunction with operational amplifier 78 to adjust the temperature to assure that the resonator temperature is close enough to the design temperature to guarantee that the temperature feedback loop will lock. The set point temperature is determined by potentiometer 76 which is connected to power source 77.

Figure 6:
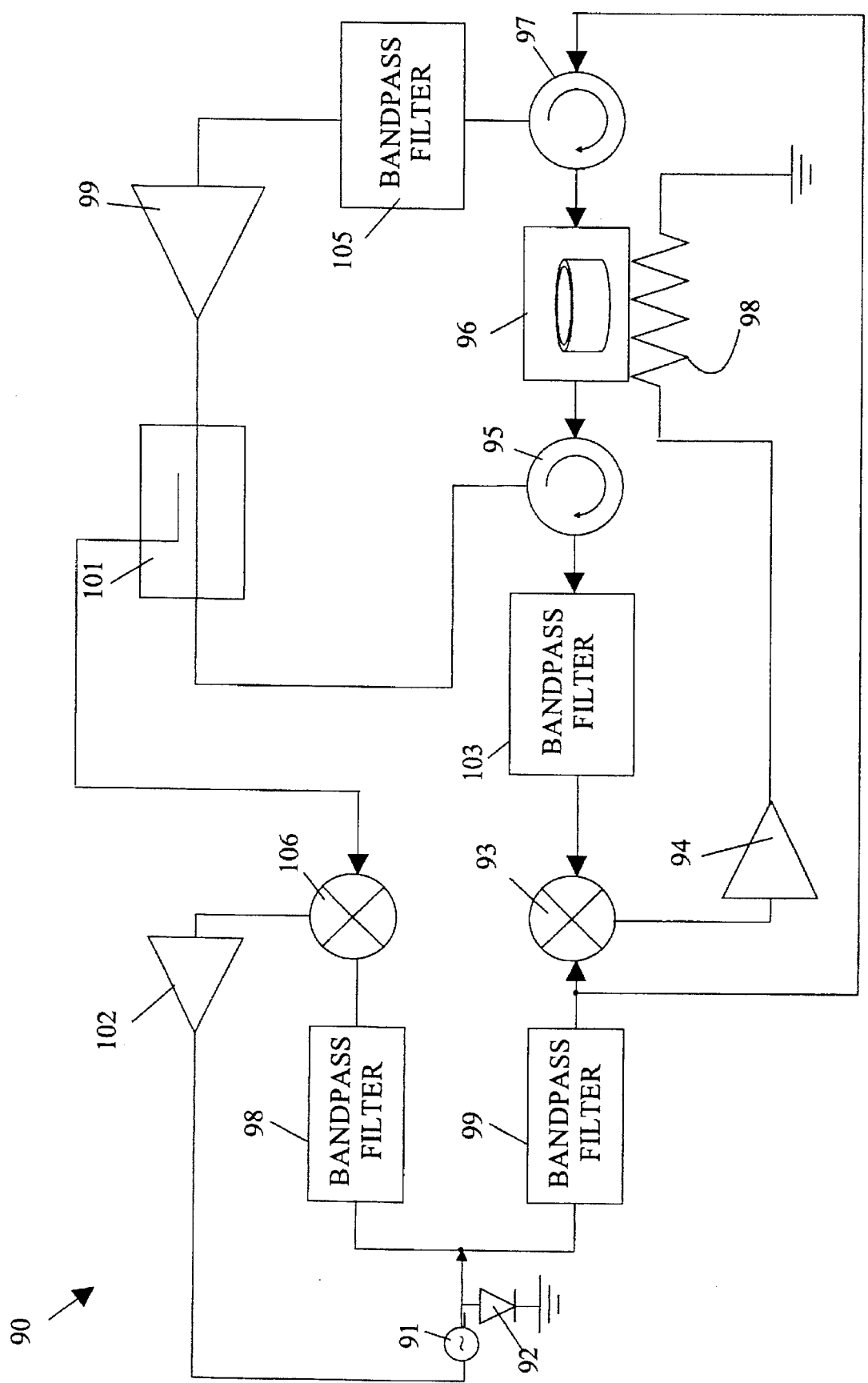
FIG. 6 is a schematic drawing of a third embodiment of a temperature control system for a whispering gallery resonator according to the present invention.

It will be apparent to those skilled in the art that there are a variety of alternative embodiments which all rely on the same underlying dual frequency system. For example, the oscillator need not actually oscillate at both of the mode frequencies. Refer now to FIG. 6 which is block diagram of a temperature control loop 90 in which the oscillator based on the whispering gallery resonator only oscillates at one frequency even though the resonator has modes at both $f_1$ and $f_2$. The reference signal equal to $Nf_2/M$ is generated by causing VCO 91 to generate a signal of frequency $f_2/M$. This frequency is applied to multiplier 92 to generate the harmonics of $f_2/M$. The $Nf_2/M$ harmonic is selected by bandpass filter 99. The output of bandpass filter 99 is applied to resonator 96 which acts as a filter. The output of the resonator for this input is applied to mixer 93 via bandpass filter 103 which selects for $Nf_2/M$. The phase error is used to control heater 98 which serves a function analogous to heater 72 shown in FIG. 5. The frequency of VCO 91 is locked at $f_2/M$ by the loop consisting of circulator 95, resonator 96, circulator 97, bandpass filter 105, amplifier 99, and feedback coupler 101 which comprise an oscillator at $f_2$. Mixer 106 and amplifier 102 apply any phase error to VCO 91 to generate the frequency lock. With this arrangement, the system behaves more like a frequency locked loop rather than a phase locked loop, and the requirements on the thermal response time discussed above are significantly reduced. On the other hand, this arrangement will cause any mixer noise to play a stronger role in that a change in the DC offset at the output of the mixer will cause a DC offset in the working frequency.

As pointed out above, whispering gallery resonators, even when operating in an ideal mode, have a two-fold degeneracy which, when coupled to the physical imperfections of real devices, leads to problems. The degeneracy arises from the symmetry of the dielectric ring. Since there is no preferred direction of travel around the ring, each eigenmode frequency has one state in which the waves propagate in a clockwise direction and one in which the waves propagate in a counter clockwise direction. Due to imperfections in real devices, as well as the non-zero size of the physical coupling loops, the nominally degenerate modes are perturbatively coupled, and their frequencies slightly separated. Also, the perturbative coupling causes the two physical modes to be standing waves, rotated by $\lambda/4$ from one another, rather than two counter-propagating waves, since the rotational symmetry has been broken by the physical perturbations. In addition; the coupling to the mode which has a magnetic field maximum at the azimuthal position of the (inductive) coupling loop is much stronger than that of the mode rotated by a quarter wavelength. However, this circumstantial frequency splitting, and preferential selective mode coupling are not enough to allow immediate use of this whispering gallery resonator in a direct feedback oscillator circuit. Hence, the preferred embodiment of the present invention uses a modification of the sapphire ring geometry which substantially changes the frequency of one of the two degenerate modes.

The preferred embodiment of the present invention is implemented by making modifications on the sapphire ring resonator at the machining stage, which eliminates the need for any perturbations of the "simple ring/enclosure" geometry such as those used in prior art systems. The modification required is to machine narrow shallow grooves in the sapphire ring at regular intervals, corresponding to the positions of the field maxima of the undesired degenerate mode. This causes the undesired mode to be increased in frequency (due to lost dielectric loading), and the frequency of the desired mode to remain virtually unchanged since the perturbations occur at the modal field nulls.

Figure 7:
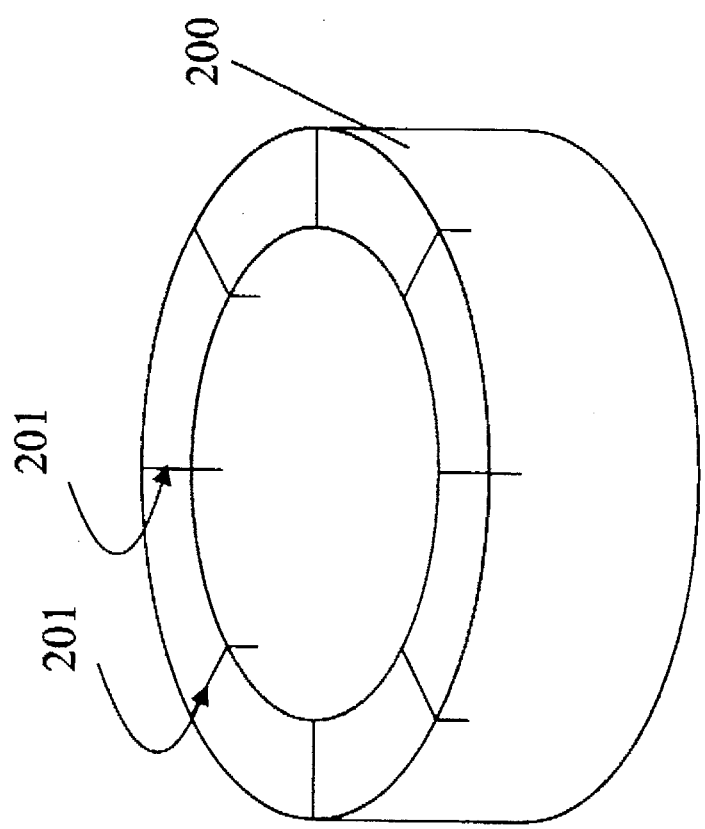
FIG. 7 is a perspective view of a dielectric ring having perturbations for altering the frequency of an undesired mode for use in a whispering gallery resonator according to the present invention.

FIG. 7 is a perspective view of a ring 200 modified in this fashion. Exemplary groves are shown at 201. If the mode number is N, there will be 2N such grooves spaced equally around the ring. In the preferred embodiment of the present invention, the grooves extend into the ring approximately 5% of the wavelength of the resonant mode.

This method of degeneracy removal provides a number of advantages over the manual tuning procedure used in prior art systems. First, the degeneracy is removed at the machining stage. There is no need for manual tuning, and no additional sapphire parts. Second, the mode frequency splitting is accurate and reproducible. Third, the degree of splitting can be calculated. Fourth, the machined grooves have very little effect on almost all of the modes except the target mode, since the perturbation tends to add in and out of phase for all modes except for the one with the correct periodicity (mode number). This is very important, because if the other modes are moved significantly, one could destroy the operational window in the dense forest of spurious modes that had previously been incorporated in the design. Finally, due to the constructive interference of the perturbation produced by the grooves, the undesired mode can easily be pushed up in frequency over 500 MHz for modest dimensions, easily putting it outside the designed operational window in the mode spectrum.

The above-described embodiment of periodic perturbations machined into the sapphire can be implemented in a number of ways. Essentially, any style of sapphire cut-out of the required periodicity will work, as long as the spatial extent in the azimuthal direction is small, so as not to perturb the desired mode significantly. The above described slots are the preferred embodiment because of their ease of "planar" fabrication using a circular diamond saw passed over the top of the ring. However, it will be apparent to those skilled in the art that other embodiments such as cutting grooves on the outer surface of the ring, or even drilling small holes in the sapphire with the specified periodicity given by the mode number will also function satisfactorily.

As noted above, the manner in which the dielectric ring is mounted plays a significant role in the overall quality of the resulting resonator. The minimal geometry of the typical resonator is shown in FIG. 1. Obviously, there must be some means of supporting the resonator in order to maintain this geometry. If the resonator is placed firmly against one wall of the enclosure, most of the benefits of high mode confinement will be lost. Thus, it is necessary to devise a mechanical support for the resonator itself which appropriately addresses the mechanical, electromagnetic and thermal requirements of the resonator system. These requirements are typically in conflict with each other. For the best mechanical properties, the support arrangement should be short and relatively massive, while the electromagnetic properties are optimized if the support is constructed from long, thin components with minimal cross-section.

There are two key considerations relevant to the electromagnetic properties of the support. First, it is essential that the support not introduce extra loss. This requirement restricts the choice of materials for the support. Ideally, the support should be constructed from a dielectric material with low dielectric constant and minimal loss tangent. Second, the support should avoid disrupting any of the electromagnetic modes of the resonator and its enclosure. As noted above, whispering gallery resonators according to the present invention are designed in conjunction with their enclosures such that the desired modes of the resonator are well-isolated in frequency from the other modes of the enclosure and resonator. The procedure for accomplishing such a design becomes computationally very complex unless extremely simple geometries with as much symmetry as possible and with a minimum of excess dielectric material present are used. The computational method for dealing with supports involves the application of perturbation theory to a design which lacks the supports. The accuracy of such predictions will be very poor unless the support members are carefully chosen to have minimal dielectric constant and cross-section.

Figure 8:
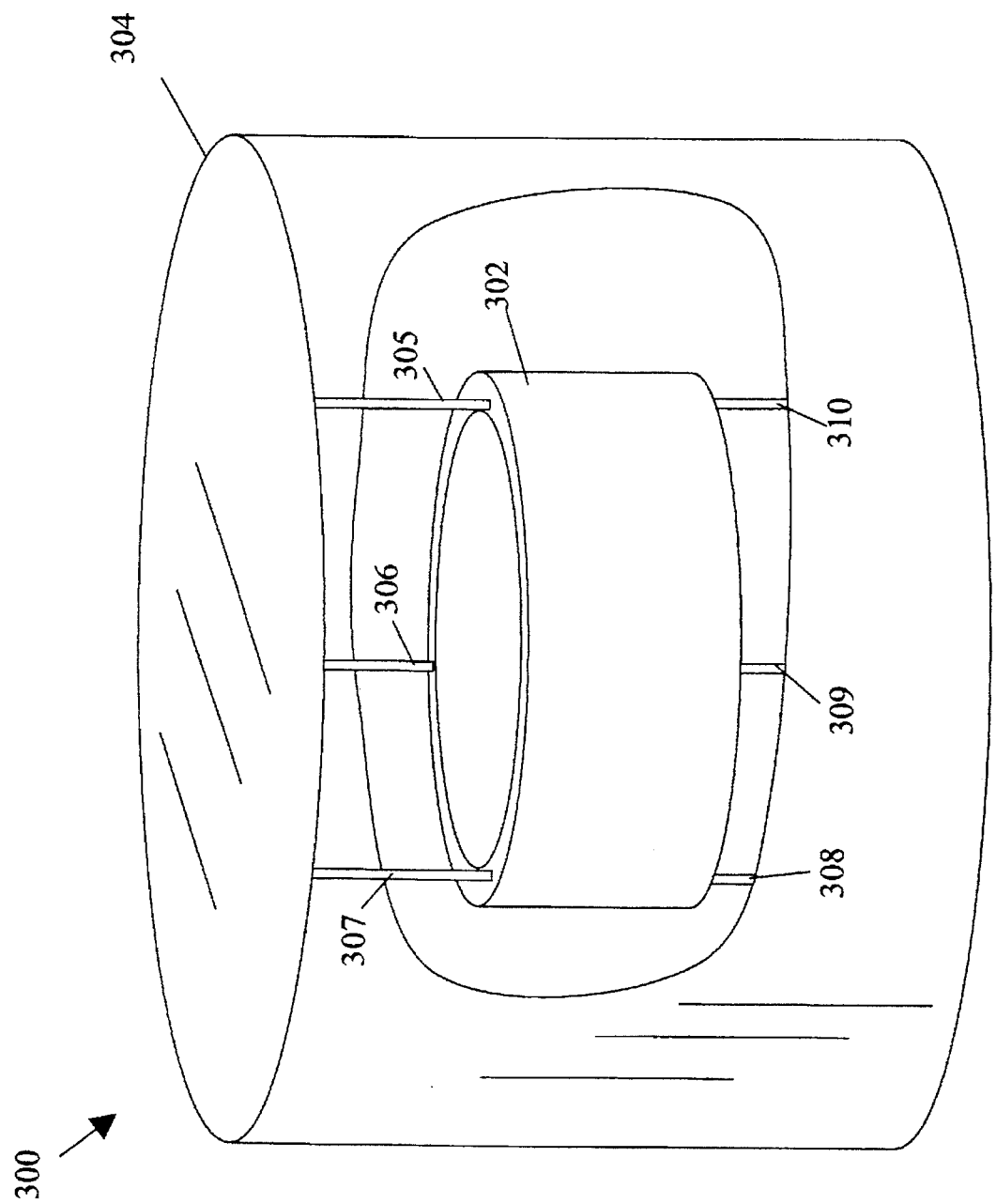
FIG. 8 is a perspective view of a whispering gallery resonator according to the present invention showing one embodiment of a support structure for the dielectric ring.

The ideal support geometry must prevent low frequency mechanical modes in which the dielectric ring is displaced either vertically or laterally in the enclosure, and modes in which the dielectric ring tilts with respect to the enclosure. To prevent tilting modes, the dielectric ring needs to be supported at a minimum of three points. Refer to FIG. 8 which is cut-away view of a resonator 300 in which the dielectric ring 302 is supported by two sets of pins from enclosure 304. Each set consists of three pins, the first set being shown at 305–307, and the second set being shown at 308–310. Even though the support 'pins' have a rather small cross-section, they can provide sufficient resistance to tilting about the center of dielectric ring because the pins are positioned relatively far from the center of rotation. Unfortunately, this geometry does not provide sufficient resistance against translational movements of the dielectric ring. This lack of resistance can lead to unacceptably low resonant frequencies for the transverse displacement modes.

Figure 9:
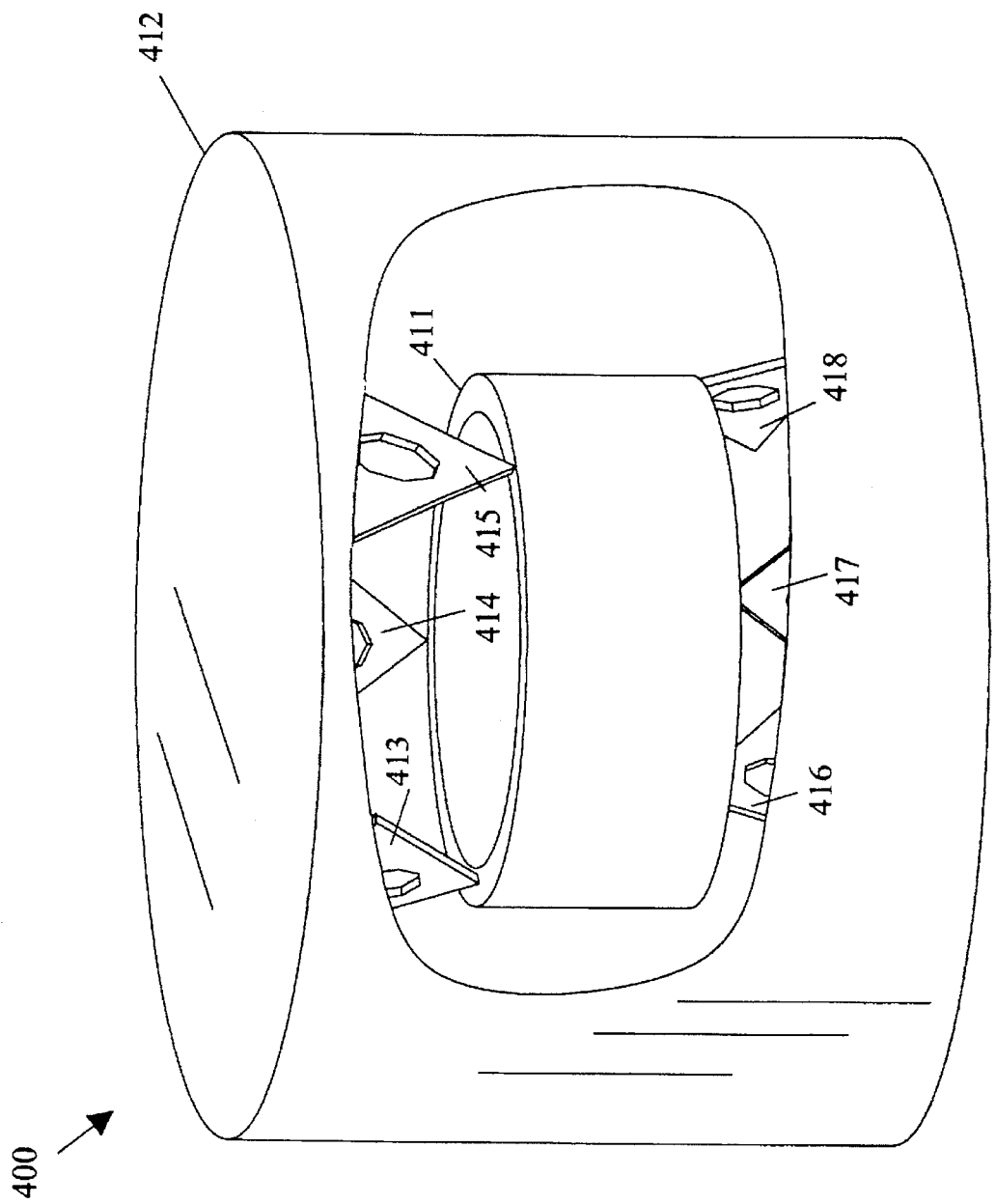
FIG. 9 is a perspective view of a whispering gallery resonator according to the present invention showing a second embodiment of a support structure for the dielectric ring.
Figure 11:
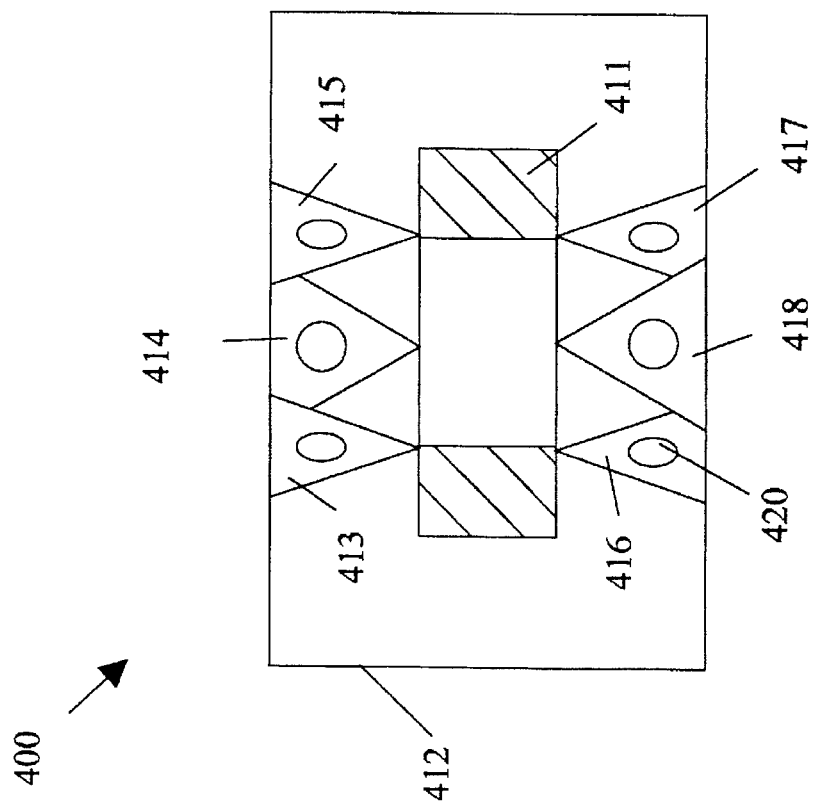
FIG. 11 is a side view of the resonator shown in FIG. 9.
Figure 10:
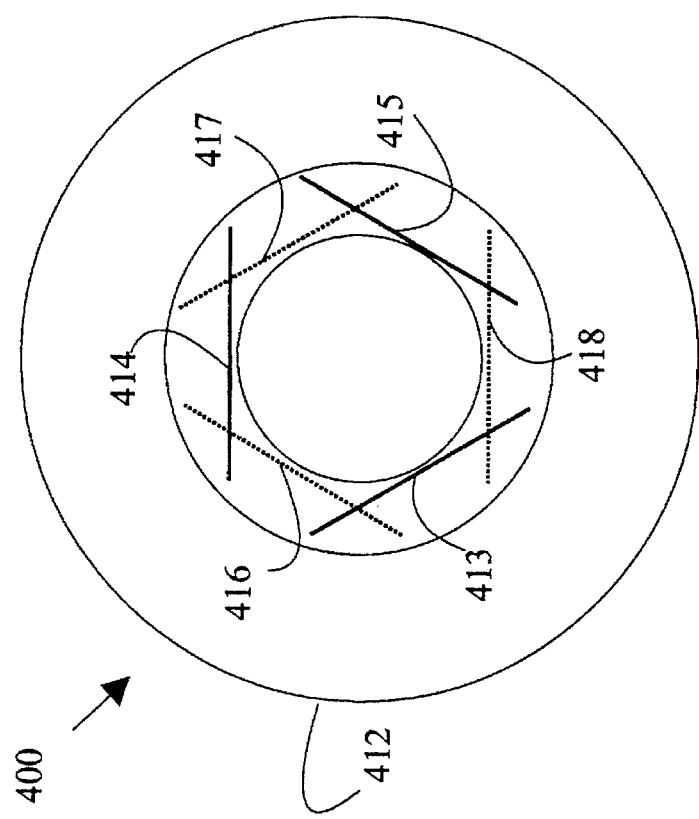
FIG. 10 is a top view of the resonator shown in FIG. 9 with the top removed.

Refer now to FIGS. 9, 10, and 11 which are a cut-away view of a whispering gallery resonator 400 utilizing one of the preferred support embodiments of the present invention, and top and side views thereof, respectively. In this embodiment of the present invention, the dielectric ring 411 is supported by planar support members 413–418. There are three such supports for positioning dielectric ring 411 with respect to the top of enclosure 412 and the remaining three supports position dielectric ring 411 with respect to the bottom of the enclosure. The supports are preferably triangular in shape with one point of the triangle contacting the dielectric ring at a point close to the inside surface of the ring. The opposite planar edge is in contact with the corresponding surface of enclosure 412. In the preferred embodiment of the present invention, material is removed from the planar support to reduce the amount of material that can perturb the operation of the resonator. The removed material is shown in the form of a hole in each of the support members. An exemplary such hole is shown in FIG. 11 at 420. This support system has the advantage of requiring only thin members constructed of low loss-tangent dielectric material that have been positioned in such a way as to provide maximum mechanical rigidity for all possible displacement modes(i.e. in all directions). The supports may be constructed from sapphire or quartz. The support components need not be constructed as monolithic portions of the resonator itself, so the fabrication cost of the resonator is kept to a minimum. For maximum rigidity, the support components should be mated together in such a manner as to help keep the parts from 'rocking' even if the components are not perfectly flat. Those sufficiently skilled in the art will recognize that this is best accomplished by means of sound kinematic design practices.

An alternative support system which has the desirable features of the system discussed with reference to FIGS. 9–11 is shown in FIGS. 12 and 13 at 500. FIG. 12 is a perspective view of a dielectric ring 511 and the attached cylindrical support members 513 and 514. FIG. 13 is a cross-sectional view of whispering gallery resonator 500 which also shows the enclosure 512. The thin cylindrical support members provide both rigidity and low loss. In addition, the geometry of these supports lends itself to efficient computation of the modes of the system.

Various modifications to the present invention will become apparent to those skilled in the art from the foregoing description and accompanying drawings. Accordingly, the present invention is to be limited solely by the scope of the following claims.

What is claimed is:

1. A whispering-gallery mode dielectric resonator, comprising:

a ring of dielectric material;

a cylindrical enclosure having a top and a bottom, said enclosure having conductive walls, said dielectric ring being contained in said enclosure, said enclosure and said ring collectively constituting a cavity having electrical resonances at plural resonant frequencies dependent on the shape and dimensions of said ring and the shape and dimensions of said enclosure, said resonant frequencies including a first resonant frequency and first and second spurious resonant frequencies, the electrical resonances at said first and second spurious resonant frequencies being the ones of said plural electrical resonances closest to said electrical resonance at said first resonant frequency at frequencies respectively greater than and less than said first resonant frequency; and means for coupling electromagnetic energy into and out of said enclosure so as to excite the resonant modes of said dielectric ring, wherein said ring and said enclosure have dimensions such that said first and second spurious resonant frequencies differ sufficiently from said first resonant frequency to allow said resonator to be used in a free-running oscillator at said first resonant frequency.

2. The resonator of claim 1 wherein said dielectric material is sapphire.

3. The resonator of claim 1 wherein said ring of dielectric material comprises a cylindrical ring having notches at a plurality of locations, said locations being equally spaced around said ring.

4. The resonator of claim 1 wherein said resonant frequencies additionally include a second resonant frequency and wherein said ring comprises a dielectric material having first and second dielectric constants depending on the direction of polarization of electromagnetic waves in said material and wherein said second resonant frequency corresponds to a resonant mode having an average field alignment that differs from that of said mode corresponding to said first resonant frequency.

5. The resonator of claim 4 further comprising frequency measuring means for determining the relationship between said first and second resonant frequencies; and heating means for heating said dielectric material in response to said measured determined relationship.

6. The resonator of claim 5 wherein the ratio of said first and second resonant frequencies are chosen to be the ratio of two integers when said dielectric ring is at a predetermined design temperature.

7. The resonator of claim 4 wherein said dielectric material is sapphire.

8. The resonator of claim 1 further comprising means for positioning said dielectric ring with respect to the top and bottom of said cylindrical enclosure, said positioning means contacting said dielectric ring at three or more contact points.

9. The resonator of claim 8 wherein said support means comprises a plurality of planar support members, each said support member being in contact with one of said contact points and either said top or said bottom of said cylindrical enclosure.

10. The resonator of claim 9 wherein each said support member is triangular in shape and wherein one point of said triangular shape is in contact with said dielectric ring.

11. The resonator of claim 9 wherein one of said support members comprises sapphire.

12. The resonator of claim 1 further comprising a cylindrical support member having one end in contact with said dielectric ring and the other end in contact with either said top or said bottom of said enclosure for positioning said dielectric ring with respect to the top and bottom of said cylindrical enclosure.

* * * * *